(12) United States Patent
Houston et al.

(10) Patent No.: US 7,816,740 B2
(45) Date of Patent: Oct. 19, 2010

(54) MEMORY CELL LAYOUT STRUCTURE WITH OUTER BITLINE

(75) Inventors: Theodore Warren Houston, Richardson, TX (US); Xiaowei Deng, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 300 days.

(21) Appl. No.: 12/209,456

(22) Filed: Sep. 12, 2008

(65) Prior Publication Data
US 2009/0173971 A1    Jul. 9, 2009

Related U.S. Application Data

(60) Provisional application No. 61/019,028, filed on Jan. 4, 2008, provisional application No. 61/019,024, filed on Jan. 4, 2008, provisional application No. 61/019,020, filed on Jan. 4, 2008.

(51) Int. Cl.
*H01L 31/119* (2006.01)
(52) U.S. Cl. ............... 257/369; 257/393; 257/350
(58) Field of Classification Search .......... 257/393, 257/369, 350, 347, 296, 204
See application file for complete search history.

(56) References Cited

U.S. PATENT DOCUMENTS 5,619,056 A * 4/1997 Kuriyama et al. ........ 257/369
6,747,323 B2 * 6/2004 Komori .................. 257/393
6,933,578 B2 * 8/2005 Sato ...................... 257/393
7,023,056 B2   4/2006 Liaw
7,164,596 B1   1/2007 Deng et al.
7,250,657 B2   7/2007 Liaw
7,271,451 B2   9/2007 Liaw

OTHER PUBLICATIONS

Ted Houston, U.S. Appl. No. 12/209,418, "Storage Cell Having Buffer Circuit for Driving the Bitline," filed Sep. 12, 2008.
Ted Houston, U.S. Appl. No. 12/209,657, "Dual Node Access Storage Cell Having Buffer Circuits," filed Sep. 12, 2008.

* cited by examiner

*Primary Examiner*—Thao Le
(74) *Attorney, Agent, or Firm*—Rose Alyssa Keagy; W. James Brady; Frederick J. Telecky, Jr.

(57) ABSTRACT

An integrated circuit (IC) includes a memory cell having source/drain regions for defining source/drains of a first pull-up or pull-down (PU/PD) transistor for a first storage node, a second PU/PD transistor for a second storage node, and driver, cell pass, and buffer pass transistors. The memory cell includes a first gate electrode region for the first PU/PD and driver transistors, a second gate electrode region for the cell pass and buffer pass transistors, and a third gate electrode region for the second PU/PD transistor. The third gate electrode region and the cell pass transistor are coupled to the first storage node and the first gate electrode region is coupled to the second storage node. The buffer pass and driver transistors are coupled to a source/drain path of the cell pass transistor and the buffer pass transistor is coupled between a bitline (BL) node and the driver transistor.

20 Claims, 7 Drawing Sheets

MEMORY CELL LAYOUT STRUCTURE WITH OUTER BITLINE

CROSS REFERENCE TO RELATED APPLICATION

This application claims the benefit of Provisional Application Ser. No. 61/019,028 entitled: "7T SRAM CELL WITH 1 WL AND 1 BL", filed Jan. 4, 2008, Provisional Application Ser. No. 61/019,024 entitled "10T SRAM Cell with 1 WL and 2 BL's (BL and BL_)", filed Jan. 4, 2008, and Provisional Application Ser. No. 61/019,020 entitled: "METHOD FOR ACCELERATING MONTE CARLO EVALUATIONS, AND CIRCUITS DESIGNED BY THIS METHOD", filed Jan. 4, 2008, which are all herein incorporated by reference in their entireties.

FIELD OF PRESENT INVENTION

The present invention relates generally to semiconductor devices, and more particularly to a memory cell layout structure for integrated circuits.

BACKGROUND

The basic CMOS 6T SRAM cell in an integrated circuit (IC) generally includes two n-type or n-channel (NMOS) pull-down or drive transistors and two p-type (PMOS) pull-up or load transistors in a cross-coupled inverter configuration. Two additional NMOS select or pass-gate transistors are added to make up a standard double-sided or differential six-transistor memory cell (a DS 6T SRAM cell, a 6T SRAM cell, or simply a 6T cell). A 5 transistor SRAM cell (5T) use a single pass-gate transistor, and a 7T cell comprises a 5T cell together with a "read buffer" coupled to the 5T cell which comprises a series connected read pass transistor and a read driver transistor.

There is a general need for a stable compact memory cells with high READ current (Iread) per area, that operates at low power (e.g. low Quiescent supply current (IDDQ), that are stable during a READ operation and can be reliably written into. However, these characteristics generally contradict one another. For example, low threshold voltage (Vt) and/or short gate lengths generally provide high Iread, but also result in high subthreshold leakage and poor cell stability. Longer channel lengths and/or higher Vt reduce subthreshold leakage and improve cell stability but degrade Iread, especially at low VDD. Similarly, changes in the transistors (such as width, length, or threshold voltage) that improve the stability during a READ generally degrade the robustness of the WRITE.

An 8T SRAM cell comprising a 6T core SRAM cell and a read buffer with separate read wordline (WL) and separate read bitline (BL) has been proposed to separate READ functionality from WRITE functionality. However, this separation of READ functionality and WRITE functionality of the conventional 8T is not effective in conventional SRAM architectures where words are interleaved in a row. Cells that are in a selected row but not a selected column (half selected cells) are subject to upset in a WRITE cycle. This upset of half selected cells can be remedied by READ and WRITE back, but additional peripheral circuitry is needed to sense the read bit lines (RBL) and drive the write bit lines (WBL) for half selected cells in a WRITE cycle.

SUMMARY

This Summary is provided to comply with 37 C.F.R. §1.73, presenting a summary of the present invention to briefly indicate the nature and substance of the present invention. It is submitted with the understanding that it will not be used to interpret or limit the scope or meaning of the claims.

The various embodiments of the present invention provide ICs and mask sets for fabricating ICs including a memory array comprising a plurality of memory cells. The memory cells can include at least a first body region having a first plurality of source/drain regions, where the first source/drain regions define source/drains for a first pull-up or pull-down (PU/PD) transistor coupled to a first storage node, a second PU/PD transistor coupled to a second storage node, a first driver transistor, a first cell pass transistor, and a first buffer pass transistor. In the memory cells, the first body region and the first plurality of source/drain regions are oppositely doped (i.e., one n-type and one p-type). The memory cells can further include a first gate electrode region defining a gate of at least the first PU/PD transistor and the first driver transistor, a second gate electrode region defining a gate of at least the first cell pass transistor and the first buffer pass transistor, and a third gate electrode region defining a gate of the second PU/PD transistor.

In the memory cells, the third gate electrode region is coupled to the first storage node, the first gate electrode region is coupled to the second storage node, and the first cell pass transistor is coupled to the first storage node. The first buffer pass transistor and the first driver transistor are also coupled to a source/drain path of the first cell pass transistor, where the first buffer pass transistor is coupled between a first bitline (BL) node and the first driver transistor.

DETAILED DESCRIPTION

Figure 1:
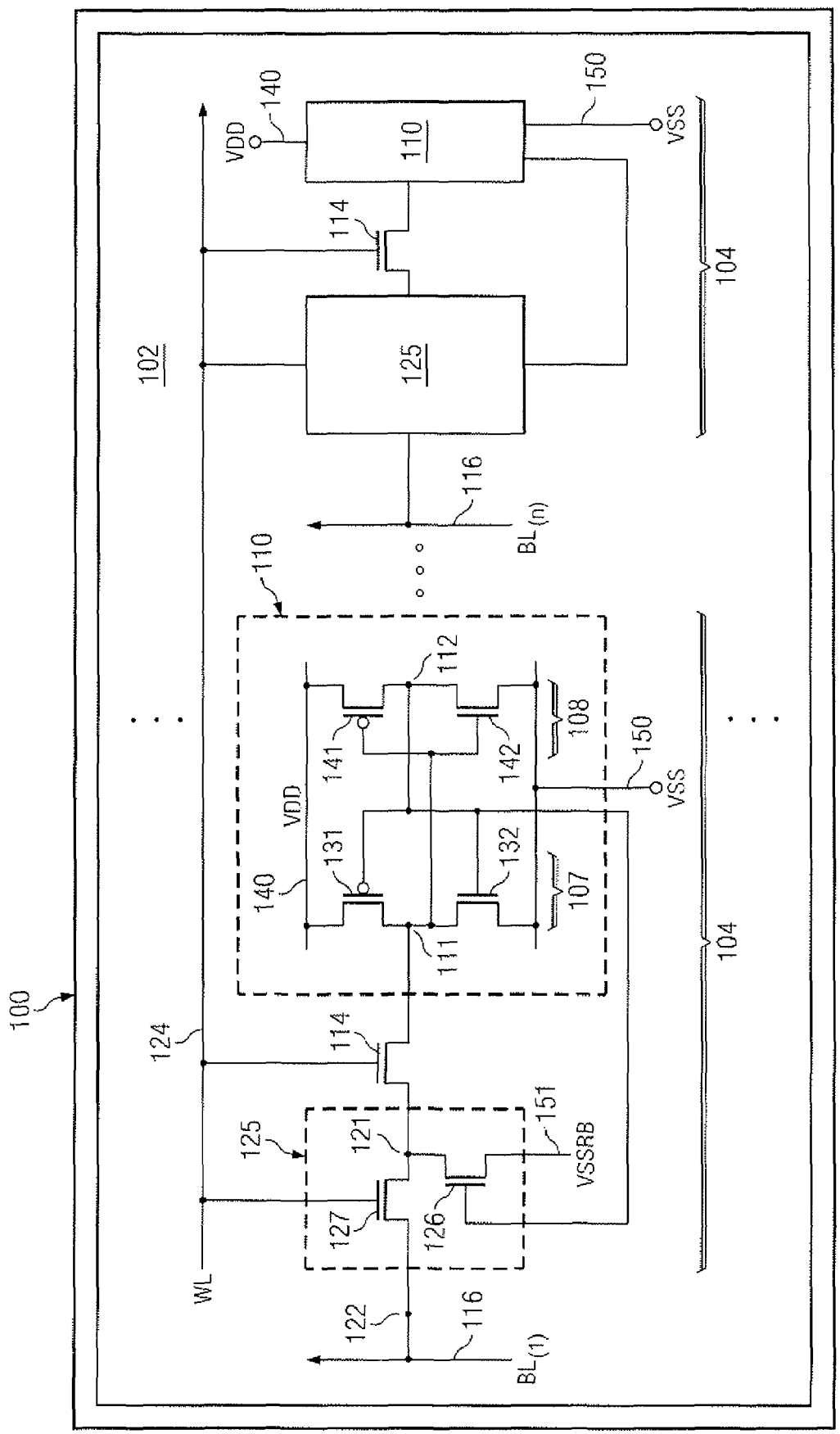
FIG. 1 is a schematic of an IC including a memory array of 7T SRAM cells configured according to an embodiment of the present invention.

The present invention is described with reference to the attached figures, wherein like reference numerals are used throughout the figures to designate similar or equivalent elements. The figures are not drawn to scale and they are provided merely to illustrate the instant present invention. Several aspects of the present invention are described below with reference to example applications for illustration. It should be understood that numerous specific details, relationships, and methods are set forth to provide a full understanding of the present invention. One having ordinary skill in the relevant art, however, will readily recognize that the present invention can be practiced without one or more of the specific details or with other methods. In other instances, well-known structures or operations are not shown in detail to avoid obscuring the present invention. The present invention is not limited by the illustrated ordering of acts or events, as some acts may occur in different orders and/or concurrently with other acts or events. Furthermore, not all illustrated acts or events are required to implement a methodology in accordance with the present invention.

Embodiments of the present invention include IC designs and mask sets for fabricating ICs including a new memory cell layout structure having buffer circuits comprising a buffer pass transistor and a driver transistor coupled for driving a bitline (BL). Embodiments of the present invention are generally applicable to core storage elements that have complementary first and second storage nodes, such as SRAMs and 4T-DRAMs, and which are accessible via either storage node. Each driver transistor is coupled to a first complementary storage node gated by the inverse voltage reflected on the second complementary storage node and vice versa. In the various embodiments, buffer circuits can be coupled to one or both of the storage nodes.

FIG. 1 is a schematic of an IC 100 including a memory array 102 with one or more instances of 7T SRAM cell 104, according to an embodiment of the present invention. The IC 100 can be formed on a substrate having a semiconductor surface. Memory cell 104 includes a 4T core storage element 110 which comprises conventional first and second cross-coupled inverters 107, 108. Respective inverters 107 and 108 comprise a p-type MOS (PMOS) pull-up or load transistor 131, 141 and an n-type (NMOS) pull-down NMOS transistor 132, 142. The first inverter 107 has a first storage node 111 and the second inverter 108 has a second storage node 112. Inverters 107 and 108 of the SRAM core 110 are connected together to a high voltage (VDD) supply line 140 and a low voltage (VSS) supply line 150. A cell pass transistor 114 is coupled to the first storage node 111.

A buffer circuit 125 comprises a buffer pass transistor 127 and a driver transistor 126, wherein the buffer pass transistor 127 is coupled between the driver transistor 126 and the source/drain path of the cell pass transistor 114. Although the terms "source" and "drain" are used below with respect to particular terminals of one or more transistors, the invention in not limited in this regard. As known to one of ordinary skill in the art, the designation of a particular terminal of a MOS transistor as a source or drain is typically based on the bias conditions of the MOS transistor. A gate of the driver transistor 126 is coupled to the second storage node 112. The driver transistor 126 can be coupled to a read buffer low voltage (VSSRB) supply line 151. However, the present invention is not limited in this regard and in the various embodiments of the present invention the VSSRB and VSS supply lines 150, 151 can be coupled to common or different voltage supply lines, as described below. A wordline (WL) 124 is also shown coupled to the gates of both the cell pass transistor 114 and the buffer pass transistor 127.

In a typical embodiment, the combination of buffer pass transistor 127 and the driver transistor 126 may be considered to be a read buffer for core storage element 110. The buffer pass transistor 127 may function as a read pass gate, while driver transistor 126 may function as a read driver. Driver 126 is operable to supply current to the BL 116 in parallel with current supplied by the core storage element 110 through cell pass transistor 114, the combined current supplied to a single READ/WRITE BL, shown as $BL_{(1)}$-$BL_{(n)}$ (hereafter BL), through buffer pass transistor 127. Thus, the driver transistor 126 assists in driving the BL 116 and reduces the probability of upset of the memory cell 104 when the memory cell 104 is accessed. However, when storage node 111 is low, storage node 112 is high, and BL 116 is precharged high, the voltage drop across the buffer pass transistor 127 reduces the voltage feeding into the cell through cell pass gate 114. Therefore, the combination of the voltage drop across buffer pass transistor 127 and the driver transistor 126 pulling node 121 low, can further enhance the isolation between the storage node 111 and the high voltage on the BL 116. Accordingly, the enhanced isolation further reduces the probability of upset in cell 104.

BL 116 is coupled to a source/drain path of the cell pass transistor 114 (and storage node 111 when cell pass transistor 114 and buffer pass transistor 127 are both on), and is thus generally operable for both reading and writing data to the first storage node 111. No BL is shown coupled to the second storage node 112. As shown in FIG. 1, BL 116 is coupled to the node identified as node 122, which is at a source/drain of buffer pass transistor 127. As noted above, the source and drain of a transistor interchanges according to the bias, and thus can be different for READ versus WRITE operations. A READ/WRITE WL 124 is shown coupled to the gate of the cell pass transistor 114 and to the gate of the buffer pass transistor 127. However, some embodiments of the present invention also can include separate READ and WRITE WL's, with the READ WL gating the buffer pass transistor 127 and the WRITE WL gating the cell pass transistor 114. In such embodiments, the READ WL can be asserted during a READ cycle, while both the READ and WRITE WL's can be asserted during a WRITE cycle.

The coupling of buffer pass transistor 127 (and thus buffer circuit 125) to the same BL 116 coupled to the cell pass transistor 114 in memory cell 104, and thus to the first storage node 111, provides a significant stability improvement over conventional memory cells which provide no such connection. A stability improvement results from buffer circuit 125 in this configuration being able to help discharge BL 116 for READ operations and for half selected cells during WRITE operations. This faster discharge of BL 116 improves the dynamic stability of the memory cell 104.

In operation of cell 104 for READ, with the single READ/WRITE BL 116 precharged high and WL 124 asserted high, when the first storage node 111 is low (and the second storage node 112 is high) the buffer circuit 125 helps pull the associated BL 116 low, thus reducing the probability of upset. In this case, it can be seen that BL 116 is pulled low (toward VSS in FIG. 1) through read driver 126 and buffer pass transistor 127 which are both on when the second storage node 112 and WL 124 are high, respectively, and thus couples the BL 116 to VSS source voltage line 150. This discharge path through the buffer circuit 125 is in addition to the conventional BL discharge path which is through cell pass transistor 114 and the pull-down NMOS transistor 132 in the inverter 107 of storage element 110. If the buffer pass transistor 127 has lower Vt relative to the Vt of the cell pass transistor 114, as WL 124 ramps up, the buffer circuit 125 will start discharging the BL 116 before the cell pass transistor 114 is turned on sufficiently for BL 116 to upset the core storage element 110. In either case, the BL 116 will discharge faster with the addition of the buffer circuit 125 versus conventional cell designs, thus adding stability to the memory cell 104 as compared to conventional cell designs that lack coupling of the buffer circuit 125 to the same BL 116 that is coupled to the first storage node 111. Further, as previously described, the two pass transistors 114, 127 in series between the BL 116 and the storage node 111, enhances isolation of the storage node 111 and the BL 116, reducing the probability of upset.

Embodiments of the present invention thus generally solve the need for a memory cell that provides compactness, high READ current per area, and low power (e.g. low IDDQ). Embodiments of the present invention also generally provide enhanced stability by taking advantage of dynamic effects for stability as described above.

The single BL 116 is provided for both reading and writing data to the storage node 111. In one embodiment of the present invention, the memory cell can have a single wordline (WL) for both READ/WRITE instead of the separate READ/WRITE WL's of conventional memory cells with read buffers. In other embodiments of the present invention, the VSSRB supply line 151 can be configured to provide a different supply voltage level as compared to the VSS supply line 150 for the core storage element 110. In particular, the VSSRB supply line 151 can be floated during a STANDBY operation to reduce leakage, and can be floated to the addressed (fully selected) cells during a WRITE operation to avoid contention with the buffer circuit 125 functioning as a write driver. Optionally, the voltage on the VSSRB supply line 151 of the addressed cells during a WRITE cycle can be raised or lowered according to the data being written.

Figure 2A:
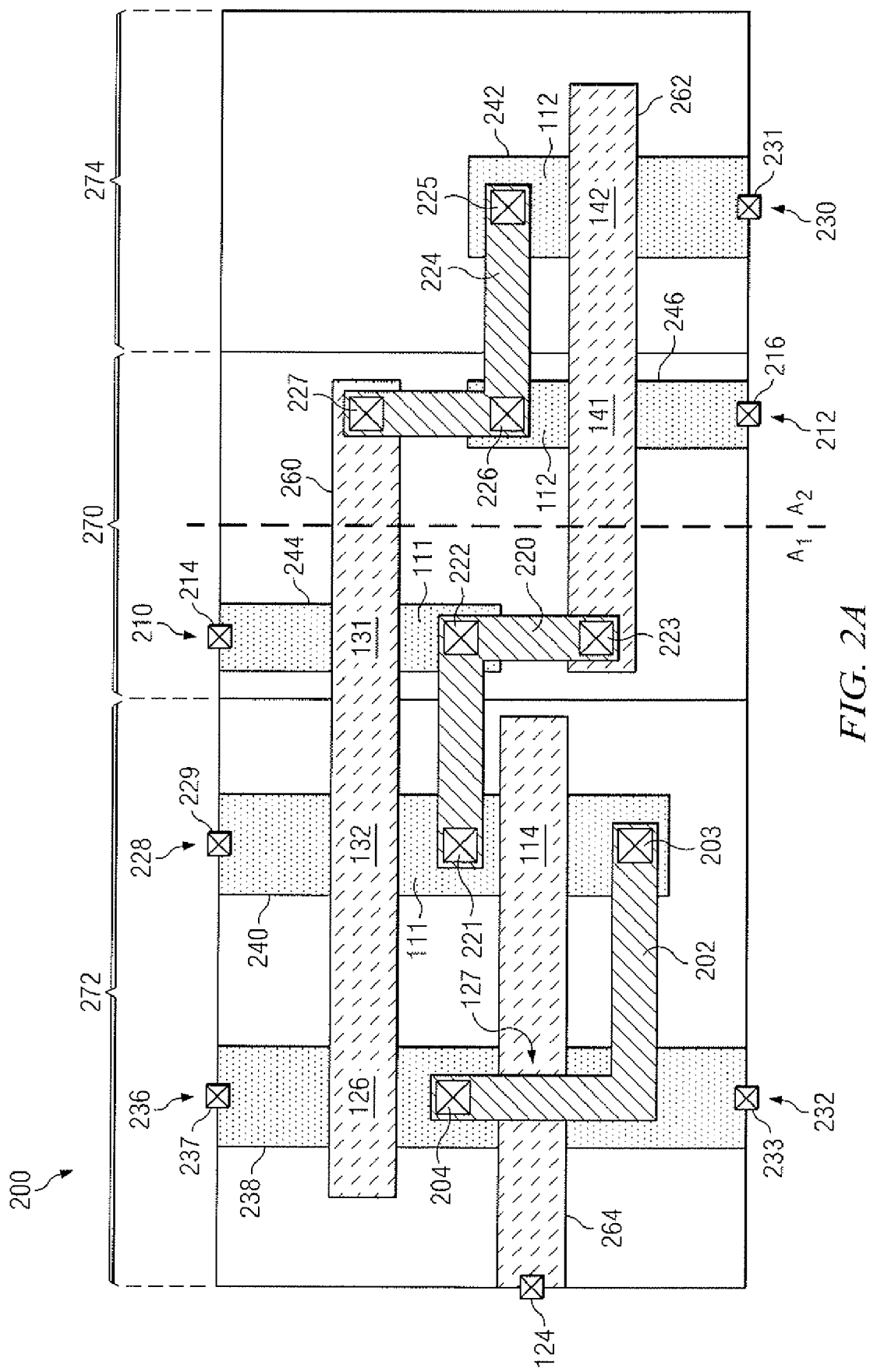
FIG. 2A is a first exemplary layout schematic for the 7T cell shown in FIG. 1 according to an embodiment of the present invention.
Figure 2B:
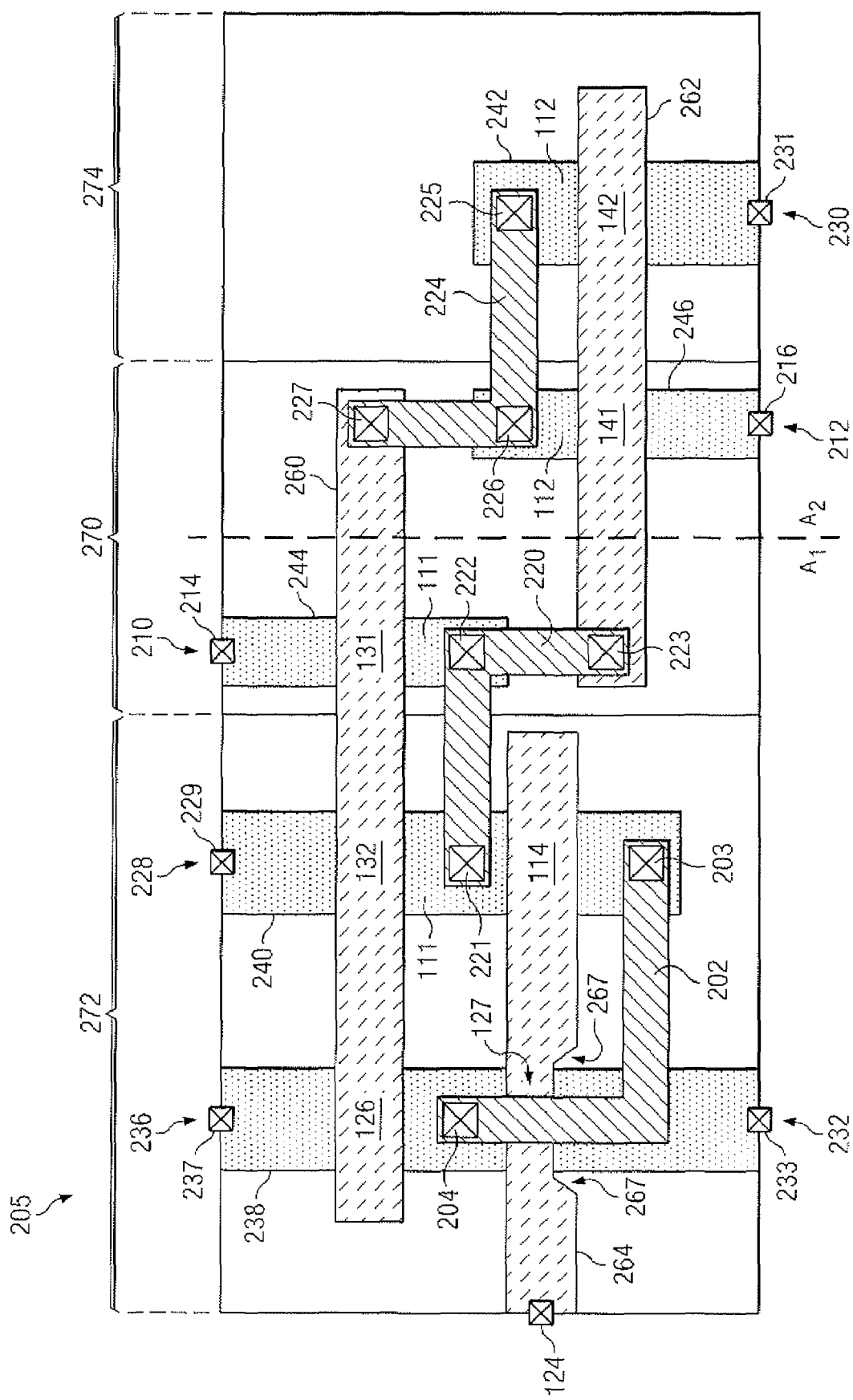
FIG. 2B is a second exemplary layout schematic for the 7T cell shown in FIG. 1 according to an embodiment of the present invention.
Figure 2C:
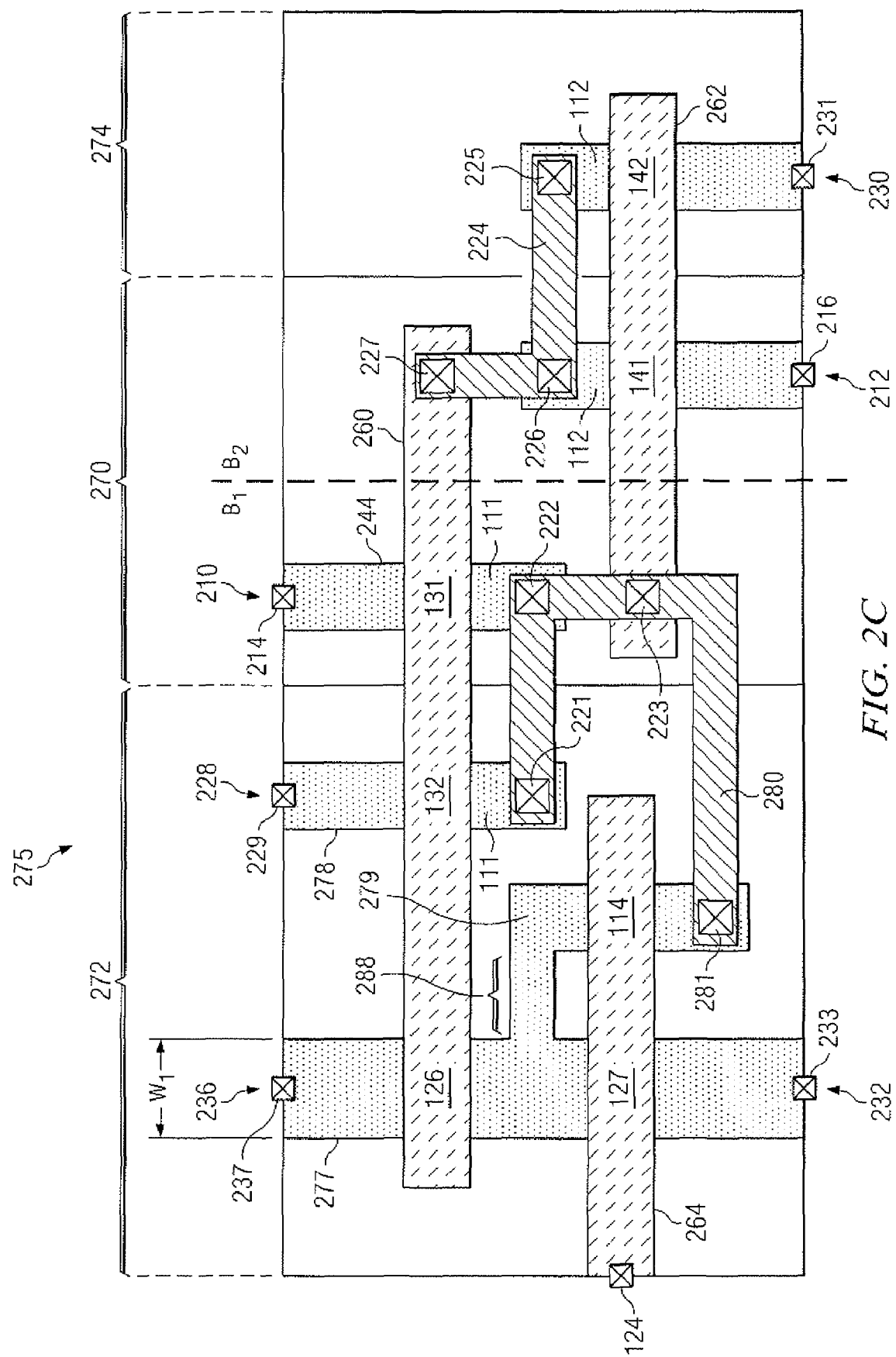
FIG. 2C is a third exemplary layout schematic for the 7T cell shown in FIG. 1 according to an embodiment of the present invention.
Figure 2D:
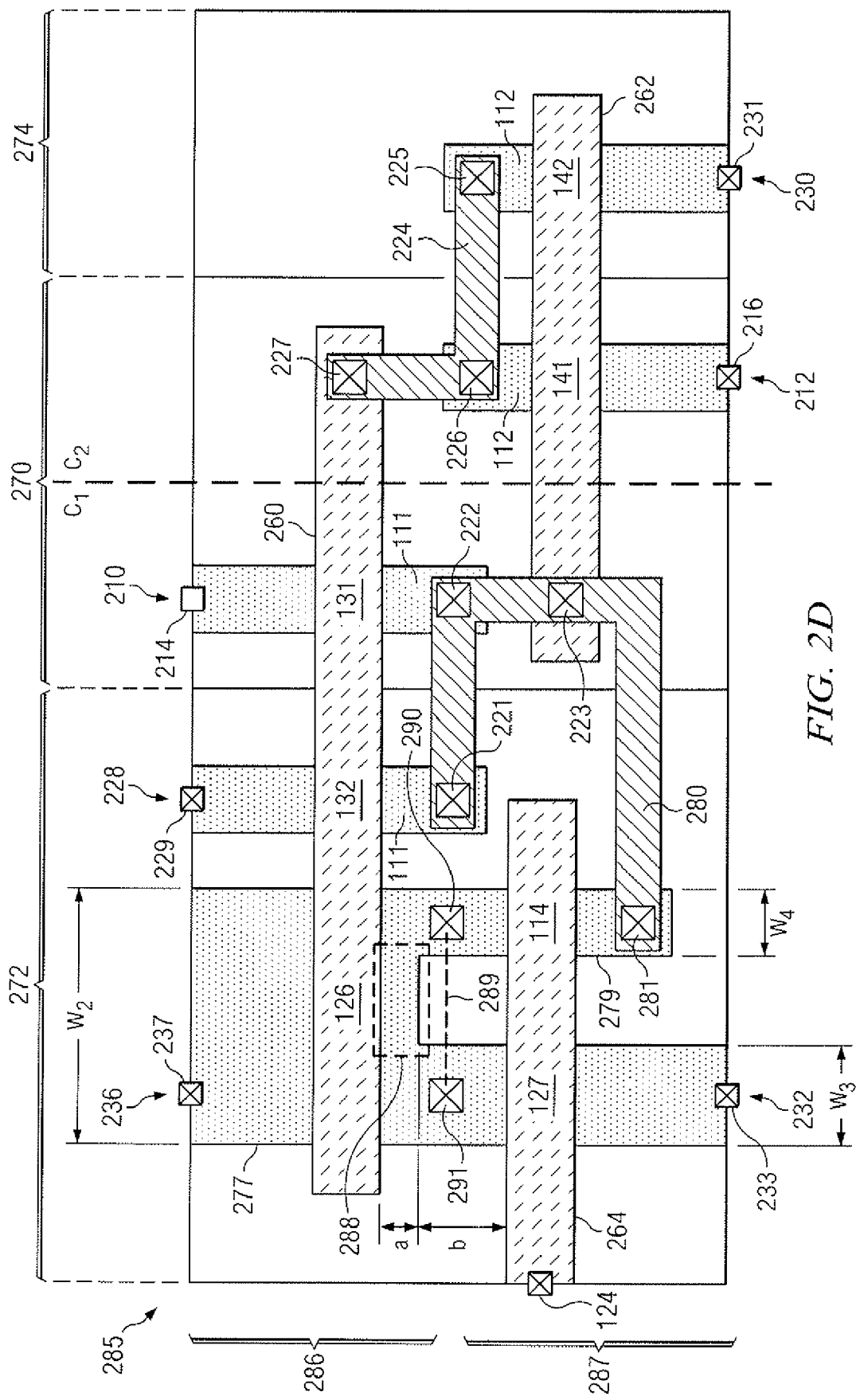
FIG. 2D is a fourth exemplary layout schematic for the 7T cell shown in FIG. 1 according to an embodiment of the present invention.

FIGS. 2A-2D are exemplary layout schematics for the 7T cell in shown FIG. 1 in accordance with various embodiments of the present invention. In particular, FIGS. 2A-2D show layout schematics for various features for masks used to define in an integrated circuit, e.g., the semiconductor devices (source/drain regions, isolation features, and/or polysilicon/gate features) and coupling features. The coupling features can include as interconnection layers (metal layers and/or interconnection polysilicon) and any associated contacts (metal and diffused). Specifically, FIGS. 2A and 2B are exemplary layout schematics where the pull-down NMOS transistor 132 and the cell pass transistor 114 shown in FIG. 1 are formed using the same n-type source/drain mask feature according to certain embodiments of the present invention. FIGS. 2C and 2D are exemplary layout schematics where the pull-down NMOS transistor 132 and the cell pass transistor 114 shown in FIG. 1 are formed in different n-type source/drain mask features in accordance with other embodiments of the present invention.

Referring now to FIG. 2A, the 7T cell 200 comprises a SRAM layout cell including a cell pass transistor 114, a buffer pass transistor 127, a driver transistor 126, a first pull-up PMOS transistor 131, a first pull-down NMOS transistor 132, a second pull-up PMOS transistor 141, and a second pull-down NMOS transistor 142 formed on a semiconductor substrate.

The first pull-down NMOS transistor 132, the cell pass transistor 114, the buffer pass transistor 127 and the driver transistor 126 can be NMOS transistors formed in a first p-type body region 272 or p-well or a deep p-well. The term "body" as used herein refers to the portion of the semiconductor surface used to form the channel of the MOS transistor. The sources and drains of driver transistor 126 and the buffer pass transistor 127 can be formed from a first source/drain mask feature 238 in p-type body region 272, where the sources and drains are oppositely doped as compared to the p-type body region, i.e., doped n-type. The sources and drains of the first pull-down NMOS transistor 132 and the cell pass transistor 114 can be formed from a second n-type source/drain mask feature 240 in p-type body region 272. The source and drain of the second pull-down NMOS transistor 142 can be formed using a third n-type source/drain mask feature 242 in a second p-type body region 274 or p-well, or a deep n-well. The sources and drains of the first pull-up PMOS transistor 131 and the second pull-up PMOS transistor 141 can be PMOS transistors formed using first and second p-type source/drain mask features 244 and 246, respectively, in oppositely doped body regions, i.e., an n-type body region or n-well 270, or a deep n-well. The source/drain mask features 238-246 and the mask features for body regions 270-274 can be arranged in the cell 200 to facilitate design of the memory array. For example, as shown in FIG. 2A, the n-type body region 270 is positioned between the p-type body regions 272 and 274 to allow mirrored or rotated images of cell 200 to abut another instance of cell 200 on each side and reduce the number of separate mask features needed for forming the n-type body region 270 and p-type body regions 272 and 274 for a memory array. Furthermore, source/drain mask features 238-246 can extend to at least one edge of the cell 200, to permit a single contact at the edge of the two abutted cells, such as VDD-type or VSS-type contacts at the edge of cell 200 in FIG. 2A, as well as reduce the number of separate source/drain mask features needed for forming the transistors in the cell 200.

The sources of the first pull-up PMOS transistor 131 and the second pull-up PMOS transistor 141 can be electrically coupled to a VDD supply line at nodes 210 and 212, respectively, located on metal 1 (M1) (not shown), via plugs 214 and 216. The drain of the first pull-up PMOS transistor 131, the drain of the first pull-down NMOS transistor 132, the drain of the cell pass transistor 114, and the gates of the second pull-up PMOS transistor 141 and the second pull-down NMOS transistors 142 are electrically coupled via an intra-cell connection 220 located on M1 and plugs 221, 222, and 223. Similarly, the drain of the second pull-up PMOS transistor 141, the drain of the pull-down NMOS transistor 142, and the gates of the first pull-up PMOS transistor 131 and the first pull-down NMOS transistor 132 are electrically coupled via an intra-cell connection 224 located on M1 and plugs 225, 226, and 227. The source of the first pull-down NMOS transistor 132 is electrically coupled to a VSS supply line at node 228 and via plug 229; and the source of the second pull-down NMOS transistor is electrically coupled to a VSS supply line at node 230 and via plug 231.

The source of the buffer pass transistor 127 is electrically coupled to the BL at node 232 and via plug 233. The buffer pass transistor 127 electrically couples the BL to the drain of the driver transistor 126 and the drain of the cell pass transistor 114. The drain of the cell pass transistor 114 and the drain of the driver transistor 126 are coupled via an intra-cell connection 202 in M1 and plugs 203 and 204. The source of the first driver transistor 126 is electrically coupled to a VSSRB supply line at node 236 and via plug 237. However, as previously described, node 236 can also be coupled to the same VSS supply line as nodes 228 and 230.

In cell 200, the first pull-up PMOS transistor 131, the first pull-down NMOS transistor 132, and the driver transistor 126 are formed using a first gate electrode region 260. The first gate electrode region 260 is coupled via plug 227 to intra-cell connection 224, as previously described. Similarly, the second pull-up PMOS transistor 141 and the second pull-down NMOS transistor 142 are formed using a second gate electrode region 262. The second gate electrode region 262 is coupled via plug 223 to intra-cell connection 220, as previously described. The connections of these gate electrode regions 260 and 262 via the intra-cell connections 220 and 224 not only provide the cross coupling required for the transistors 131, 132, 141, and 142 to form the 4T core storage element, but also provide the gate of the driver transistor 126 with the signal from the complementary node of the 4T core storage element.

Additionally, the cell pass transistor 114 and the buffer pass transistor 127 are formed using a third gate electrode region 264. The third gate electrode region 264 is electrically coupled to the WL via plug 124 to connect the gates of the cell pass transistor 114 and the buffer pass transistor 127 to the WL. However, embodiments of the present invention are not limited in this regard. In some embodiments, the third gate electrode region 246 can be replaced and two unconnected gate areas for cell pass transistor 114 and buffer pass transistor 127 to contact different WL. In some embodiments, the configuration of the third gate electrode region 264 can also be selected to reduce the number of contacts in a memory array. For example, as shown in FIG. 2A, by extending the third gate electrode region to an edge of cell 200, a mirror of cell 200 can abut to the edge of cell 200, allowing a single plug 124 to be used for contacting the third gate electrode region 264 of more than one cell.

In the various embodiments of the present invention, the dimensions of the various transistors in the cell 200 are defined by the dimensions of the source/drain region for the transistor and the dimensions of the common gate electrode regions. Accordingly, the channel length and/or channel width of the gates of the various transistors can vary. However, as previously described, in some embodiments, the buffer pass transistor 127 can have a lower Vt than the cell pass transistor 126. Although adjustment of implant conditions can be used to adjust the Vt, the dimensions of these gates (gate channel width and/or gate channel length) can also be adjusted to change Vt. In such embodiments, the dimensions of the buffer pass transistor can be adjusted relative to the dimensions of the cell pass transistor or vice versa, to provide a difference in Vt. In such embodiments, the buffer pass transistor 127 can have a channel length that is at least 5% smaller than the cell pass transistor 114 to provide a difference of at least 10 mV in Vt, for example. The relation of Vt to gate length depends on the transistor design. Generally, the nearer the gate length to the minimum gate length, the greater the reduction in Vt for a given reduction in gate channel length. Such a configuration is illustrated in FIG. 2B. As shown in memory cell 205 in FIG. 2B, gate electrode region 264 can include one or more jogs 267 for reducing the gate channel length of the buffer pass transistor 127. The jogs 267 result in a channel gate length for the buffer pass transistor 127 that is least 5% smaller than the gate channel length for the cell pass transistor 114 in instances of cell 205 in a memory array, on average, resulting in a reduced Vt for the instances of cell 205.

However, a cell implementing the 7T SRAM cell 104 shown in FIG. 1 is not limited to the cell layouts depicted in FIGS. 2A and 2B. The present inventors have discovered that by adjusting the geometry of the source/drains 238 and 240 in cell 200, the number of intra-cell connections required can be reduced. FIG. 2C shows a second exemplary layout schematic for the 7T cell shown in FIG. 1 according to an embodiment of the present invention with a reduced amount of intra-cell connections.

In FIG. 2C, the cell 275 is configured similar to cell 200 in FIG. 2A with a few exceptions. The present inventors have noted that in the cell 104 shown in FIG. 1, the source of the buffer pass transistor 127 and the drains of the cell pass transistor 114 and the driver transistor 126 are coupled to the same node formed by the intra-cell connection 202. Accordingly, the present inventors have discovered that rather than using an intra-cell connection, a common n-type source/drain region can be used for transistors 114, 126, and 127. In particular, as shown in FIG. 2C, the cell pass transistor 114 in cell 275 is formed in the same n-type source/drain region as the buffer pass transistor 127 and the driver transistor 126. Therefore, in p-type body region 272, the arrangement of the first and second n-type source/drain mask features regions is adjusted. As shown in FIG. 2C, the first source/drain mask feature 278 forms only the source and drain of the first pull-down NMOS transistor 132 and the second source/drain mask feature 277 is used for forming sources and drains for transistors 114, 126, and 127. In such embodiments, the cell pass transistor 114 is formed in an extension region 279 of the second n-type source/drain mask feature 277 that extends parallel to the portion of the n-type source/drain mask feature 277 for forming the buffer pass transistor 127. Such a configuration allows the previously described third gate electrode region 264 to be used for providing the WL signal to the pass transistors 114 and 127 without requiring addition changes to the third gate electrode region.

Furthermore, the configuration in FIG. 2C reduces the number of necessary contacts down to the cell 275. That is, since the drains of the cell pass transistor 114 and the driver transistor 126 are now the same node, no intra-cell contacting feature is required and thus the pair of contacts 203 and 204 are no longer needed. Instead, only a single intra-cell connection 280 with plugs 221, 222, 223, and 281. Although an additional plug 281 for connection 280 is needed, the net number of plugs needed in cell 275 is still reduced as compared to cell 200.

The present inventors have also discovered that further adjustment of the geometry of the n-type source/drain mask features can also be provided to enhance the ability of the drive transistor to provide an increased current to the bitline coupled to the drain of the buffer pass transistor 127. For, example, the inventors have noted that the arrangement in FIG. 2C results in an increased spacing between the driver transistor 126 and the first pull-down NMOS transistor 132. Accordingly, the present inventors have discovered that this space can be reclaimed for use by the driver transistor to improve discharge of the BL. Namely, to increase the channel width of the gate of the driver transistor 126, resulting in an increase in the drive current of the drive transistor and an improved discharging of the bitline when the core storage element is storing a low. FIG. 2D shows a second exemplary layout schematic for the 7T cell shown in FIG. 1 illustrating such a layout.

In FIG. 2D, the cell 285 is configured similarly to cell 275 shown in FIG. 2C. However, in FIG. 2D, the n-type source/drain mask feature 277 includes a first portion 286 and a second portion 287 for forming the sources and drains of the driver transistor 126 and the buffer pass transistor 127, respectively. The n-type source/drain mask feature 277 also includes the extension region 279, as previously described. The extension region 279 can extend from the first portion 286, but needs to extend from a portion on the same side of the first common gate electrode 260 to form a source/drain node that maintains a proper connection to the common node at the drain of the driver transistor 126 and the source of the buffer pass transistor 127. This can be accomplished in the various embodiments by including at least a connecting portion 288 between the extension region 279 and the portion of the second n-type source/drain extension region 279 defining the source of the buffer pass transistor 127. As described above, the width of the first portion 286 is increased as compared to that in FIG. 2C (W1<W2) to provide an increased drive current for driver transistor 126. This not only increases the rate at which the charge on the bitline can be reduced, but also reinforces a low value being stored on the accessed node of the core storage element (the signal being stored on intra-cell connection 280), further reducing the possibility of upset. In such embodiments, the driver transistor 126 can have a gate channel width greater than or equal to the sum of the gate channel width (W3) of the buffer pass transistor 127 and the gate channel width (W4) of the cell pass transistor 114.

Although inclusion of an extension region 279 reduces the number of contacts and intra-cell connections needed in the cells 275 and 285, such a configuration can also increases difficulties during a WRITE operation in the case of writing a high value to the core storage element. In particular, because the cell pass transistor 114 and the buffer pass transistor 127 are now coupled via the n-type body region and not a low-resistivity metalized intra-cell connection, a greater WRITE voltage may be needed on the bitline during the WRITE operation to properly change the state of the cell. However, rather than increasing the amount of voltage needed (and thus power needed for operation of the memory cell), some embodiments of the present invention can include features to reduce resistivity between the cell pass transistor 114 and the buffer pass transistor 127.

In some embodiments, the connecting portion 288 of the extension region 279, as shown in FIGS. 2C and 2D, can comprise a highly doped n-type body region, optionally with a silicide or clad metal to reduce resistivity. Such a region can also be formed by additional ion implantation of n-type dopants and/or utilizing n-type dopant diffusion processes. Such a configuration allows a low resistivity connection to be provided without increasing the number of contacts or intra-cell connections. In other embodiments, an additional intra-cell connection can be provided. For example, in the configuration in FIG. 2D, the discharge enhancement provided by the larger width transistor can offset any disadvantages in using additional contacts and intra-cell connections. In such embodiments, the cell 285 can include an additional intra-cell connection 289 between the source of the buffer pass transistor 127 and drain of the cell pass transistor 114. Such an intra-cell connection 289 can be formed in M1 with plugs 290 and 291.

In still other embodiments, the ratio of lengths a and b shown in FIG. 2D can be adjusted. That is, by increasing the width of the contacting region 288 and decreasing b, the size of contacting region 288 can be increased, decreasing the overall resistivity between the drain of the cell pass transistor 114 and the source of the buffer pass transistor 127.

Figure 3A:
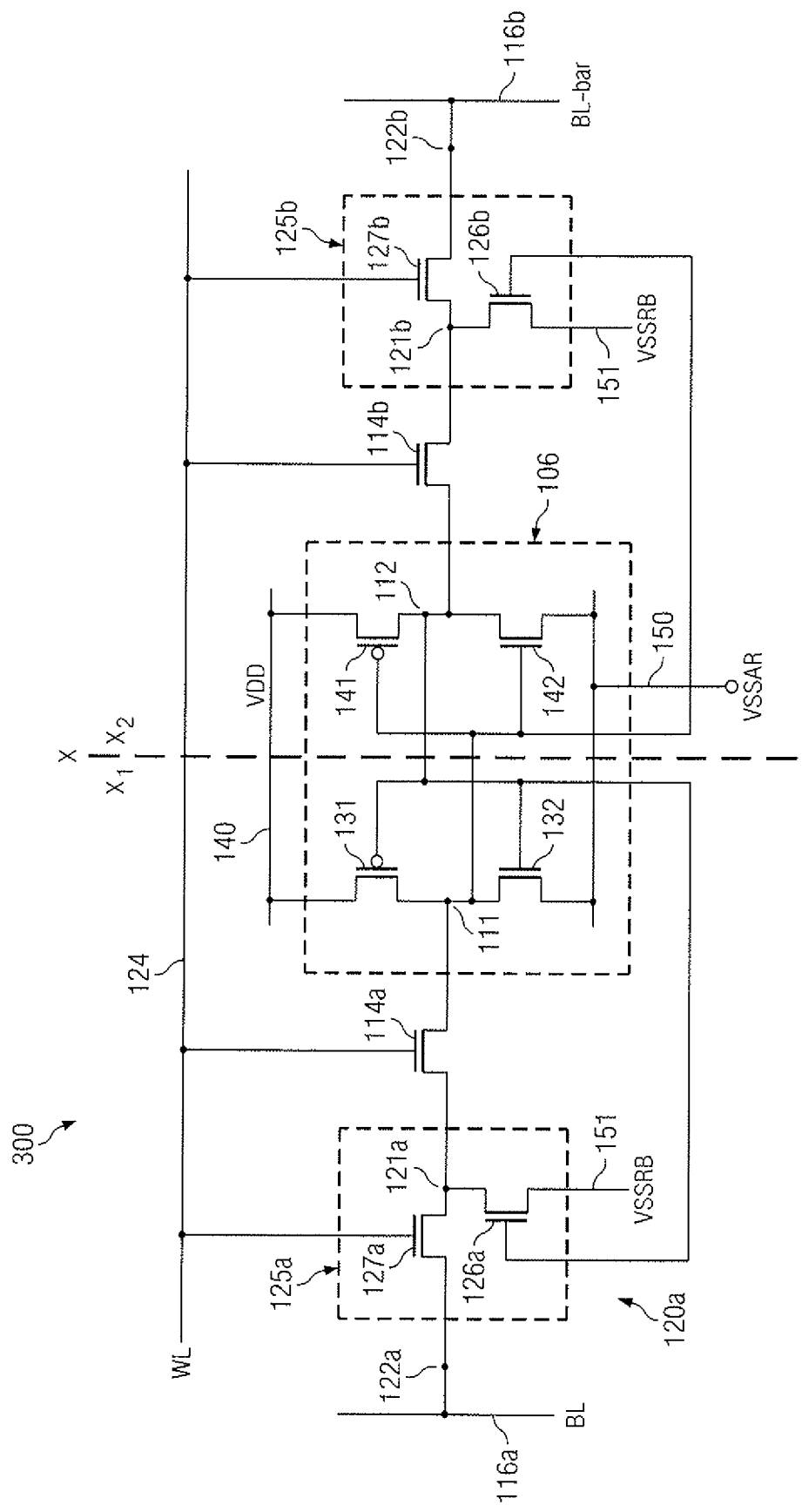
FIG. 3A is schematic of a 10T SRAM cell configured according to an embodiment of the present invention.

The layout techniques presented in FIGS. 2A-2D are not limited for use with the 7T cell 104 shown in FIG. 1 and can be used with other memory cells providing dual storage nodes. For example, one alternate memory cell design having dual storage nodes is shown in FIG. 3A. FIG. 3A is schematic of a 10T SRAM cell configured according to an embodiment of the present invention.

In FIG. 3A, a 10T SRAM memory cell 300, configured similarly to cell 104, except that now buffer circuits are coupled to both storage nodes, is shown. As in FIG. 1, the memory cell 300 in FIG. 3A includes a 4T SRAM core storage element 106 coupled to VDD supply voltage 140 and a VSSAR supply voltage 150 and having first and second complementary storage nodes 111, 112. However, in memory cell 300, each of the storage nodes 111, 112 is coupled to complementary bitlines (BL 116a and BL-bar 116b) at nodes 122a and 122b, respectively, via respective ones of first and second cell pass transistors 114a, 114b and first and second buffer circuits 125a, 125b. Each of the buffer circuits 125a and 125b include a buffer pass transistor 127a, 127b and a driver transistor 126a, 126b. Each of the buffer circuits 125a, 125b can also be coupled to the VSS supply line (not shown) or a separate VSSRB supply line 151 for providing different voltages to the core storage element 106 and the buffer circuits 125a and 125b. The operation of each of buffer circuits 125a and 125b is identical to that of buffer circuit 125, as previously described with respect to FIG. 1.

In general, the additional bitline (BL-bar) and the additional buffer circuit 125b further increases the dynamic stability of the cell by reinforcing any high value stored at one of nodes 111 and 112. Differential READ and differential WRITE are also enabled. During a READ operation, both BL 116a and BL-bar 116b are pre-charged high. However, because the nodes 111 and 112 store complementary values, only one of driver transistors 126a and 126b will be turned on during a READ operation. If a low value is stored at node 111, BL 116a can be quickly discharged by buffer circuit 125a, as previously described in FIG. 1 for buffer circuit 125. The low value stored at storage node 111 also prevents driver transistor 126b from turning on. If transistor 126b is off, BL-bar 116b is not discharged by the buffer 125b and the high pre-charge voltage on BL-bar 116b further reinforces the high value at storage node 112, increasing overall stability.

Figure 3B:
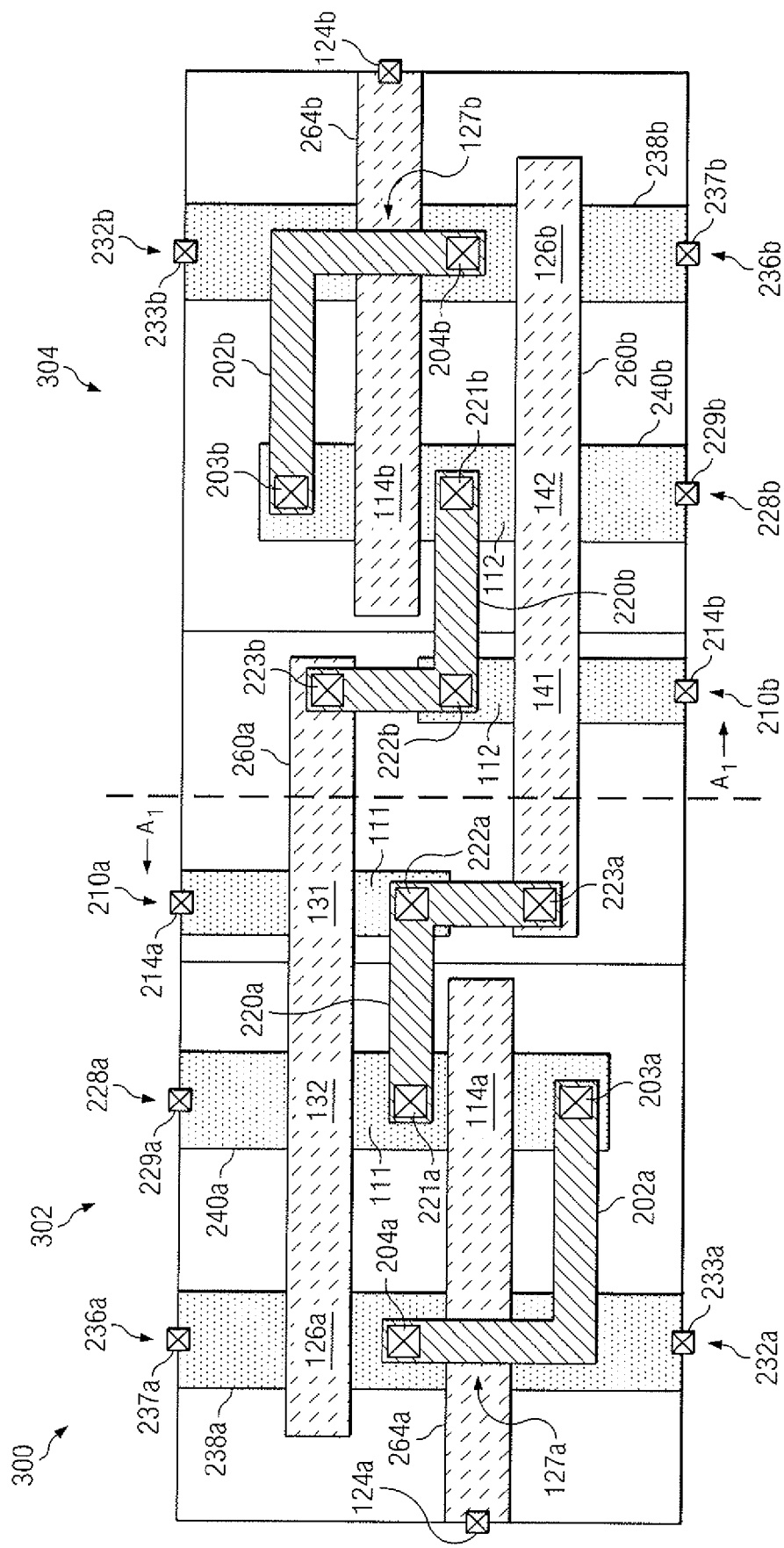
FIG. 3B is a first exemplary layout schematic for the 10T cell shown in FIG. 3A according to an embodiment of the present invention.

As previously described, the layout techniques used in the 7T cell shown in FIGS. 2A-2D can be used to form a layout for the 10T cell shown in FIG. 3A. In particular, the present inventors note that the 10T cell in FIG. 3A is symmetric along axis X and that that the arrangement on side X1 is the mirror image of the circuit arrangement on side X2. One of ordinary skill in the art will recognize that this feature of symmetric SRAM circuits is advantageous for designing SRAM cells. In particular, this property allows the layout to be arranged symmetrically by forming a cell from two identical halves, where one of the halves is a rotated version (180 degrees) of the other half. Therefore, in order to include a buffer circuit for both storage nodes of the 4T SRAM core storage element, the portion of the 7T cells 200, 275, and 285 including one half of the 4T SRAM core storage element and the buffer circuit can be replicated and rotated to provide a layout for the 10T cell shown in FIG. 3A. For example, in the case of FIG. 2A, portion A2 would be discarded and portion A1 would be replicated and rotated. The result of this replication and rotation is shown in FIG. 3B. FIG. 3B is an exemplary layout schematic for the 10T cell in FIG. 3A according to an embodiment of the present invention. In particular, FIG. 3B shows a layout comprising two halves 302 and 304, where 302 comprises portion A1, as shown in FIG. 2A, and 304 comprises portion A1, rotated 180 degrees. Accordingly, each feature in portion A1 is duplicated, resulting in four n-type source drain regions (238a, 240a, 238b, and 240b) and four gate electrode regions (260a, 264a, 260b, 264b). This is illustrated in FIG. 3B for memory cell 300 by the designations XXXa and XXXb for duplicate features. For example, as shown in FIG. 3B, gate electrode regions 264a and 264b would be coupled to the WL at via plugs 124a and 124b. However, not all duplicate nodes would be coupled to the same signals. For example, nodes 232a and 232b would be coupled to BL and BL-bar, respectively.

However, the layout of the 10T in FIG. 3A is not limited to the configuration in FIG. 3B. In other embodiments, a layout for the 10T cell shown in FIG. 3A can be formed using the layout in FIG. 2B by discarding portion B2 and replacing B2 with a rotated copy of portion B1. Alternatively, a layout for the 10T cell in FIG. 3A can be formed using the layout in FIG. 2C by discarding portion C2 and replacing C2 with a rotated copy of portion C1.

Although the exemplary embodiments utilize a buffer circuit including solely NMOS transistors, the present invention is not limited in this regard. In other embodiments of the present invention, the buffer circuit can be formed utilizing PMOS transistors. Furthermore, although the memory cell is formed primarily from NMOS transistors, in some embodiments, the polarity of the doping in the various regions can be inverted to provide a memory cell formed primarily from PMOS transistors.

The semiconductor substrates referred to herein can include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, the present invention can be used in a variety of processes including bipolar, CMOS, BiCMOS and MEMS.

While various embodiments of the present invention have been described above, it should be understood that they have been presented by way of example only, and not limitation. Numerous changes to the disclosed embodiments can be made in accordance with the disclosure herein without departing from the spirit or scope of the present invention. For example, the roles of NMOS and PMOS may be interchanged, along with an exchange of VDD and VSS. Thus, the breadth and scope of the present invention should not be limited by any of the above described embodiments. Rather, the scope of the present invention should be defined in accordance with the following claims and their equivalents.

Although the present invention has been illustrated and described with respect to one or more implementations, equivalent alterations and modifications will occur to others skilled in the art upon the reading and understanding of this specification and the annexed drawings. In addition, while a particular feature of the present invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the present invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

What is claimed is:

1. An integrated circuit (IC) including a memory array having a plurality of memory cells, each memory cell in said memory array comprising:
    at least a first body region comprising a first plurality of source/drain regions, said first plurality of source/drain regions defining source/drains of a first pull-up or pull-down (PU/PD) transistor coupled to a first storage node, a second PU/PD transistor coupled to a second storage node, a first driver transistor, a first cell pass transistor, and a first buffer pass transistor, said first body region and said first plurality of source/drain regions being oppositely doped;
    a first gate electrode region defining a gate of at least said first PU/PD transistor and said first driver transistor;
    a second gate electrode region defining a gate of at least said first cell pass transistor and said first buffer pass transistor; and
    a third gate electrode region defining a gate of said second PU/PD transistor,
    wherein said third gate electrode region is coupled to said first storage node, said first gate electrode region is coupled to said second storage node, said first cell pass transistor is coupled to said first storage node, said first buffer pass transistor and said first driver transistor are coupled to a source/drain path of said first cell pass transistor, and said first buffer pass transistor is coupled between a first bitline (BL) node and said first driver transistor.

2. The integrated circuit of claim 1, wherein said first plurality of source/drain regions comprises at least a first cell source/drain region for defining said first PU/PD transistor and at least a second cell source/drain region for defining said first driver transistor and said first buffer pass transistor, and wherein one of said first and said second source/drain regions defines said first cell pass transistor.

3. The integrated circuit of claim 2, wherein said second cell source/drain region defines said first cell pass transistor, and wherein said second cell source/drain region further comprises an extension region for defining said first cell pass transistor.

4. The integrated circuit of claim 3, further comprising a coupling feature electrically connecting said first cell pass transistor and said first buffer pass transistor in said second cell source/drain region.

5. The integrated circuit of claim 4, wherein said coupling feature comprises one or more metal interconnection regions, a low resistivity silicon-comprising interconnection region, or a low resistivity diffusion region.

6. The integrated circuit of claim 1, further comprising:
    at least a second body region comprising a second plurality of source/drain regions, said second plurality of source/drain regions defining source/drains of a third PU/PD transistor coupled to said first storage node and a fourth PU/PD transistor coupled to said second storage node, said second body region and said second plurality of source/drain regions being oppositely doped, and said first and said second body regions being oppositely doped;
    wherein said first and said second PU/PD transistors are further coupled to a first voltage supply line, wherein said third and said fourth PU/PD transistors are further coupled to a second voltage supply line, wherein said first gate electrode region further defines a gate of said third PU/PD transistor, and wherein said third gate electrode region further defines a gate of said fourth PU/PD transistor.

7. The integrated circuit of claim 6, wherein said first plurality of source/drain regions comprises a plurality of n-type source/drain regions, and wherein said second plurality of source/drain regions comprises a plurality of p-type source/drain regions.

8. The integrated circuit of claim 1, wherein an average channel width of said first driver transistor in said memory cells is greater than or equal to the sum of an average channel width of said first buffer pass transistor and an average channel width of said first cell pass transistor in said plurality of memory cells.

9. The integrated circuit of claim 1, wherein an average gate channel length of said first buffer pass transistor in said plurality of memory cells is at least 5% percent less than an average gate channel length of said first cell pass transistor in said plurality of memory cells.

10. The integrated circuit of claim 1, wherein said first plurality of source/drain regions further comprises at least a third cell source/drain region defining said second PU/PD transistor and at least a fourth cell source/drain region defining a second driver transistor and a second buffer pass transistor, wherein one of said third and said fourth cell source/drain regions further define a second cell pass transistor, wherein said third gate electrode region further defines a gate of said second driver transistor, and wherein said integrated circuit further comprises:
a fourth gate electrode region defining a gate of said second cell pass transistor and said second buffer pass transistor, wherein said second cell pass transistor is coupled to said second storage node, wherein said second buffer pass transistor and said second driver transistor are coupled to a source/drain path of said second cell pass transistor, and wherein said second buffer pass transistor is coupled between a second BL node and said second driver transistor.

11. A mask set for forming an integrated circuit (IC) including a memory array having a plurality of memory cells, said mask set defining a plurality of features for each memory cell in said memory array, said mask set comprising:
at least a first source/drain mask comprising a first plurality of source/drain features for said cell, said first plurality of source/drain features defining a plurality of source/drains in said memory cell defining a first pull-up or pull-down (PU/PD) transistor coupled to a first storage node, a second PU/PD transistor coupled to a second storage node, a first driver transistor, a first cell pass transistor, and a first buffer pass transistor;
at least one gate electrode region mask comprising a plurality of gate electrode features for said cell, said gate electrode features defining at least first, second, and third gate electrode regions in said memory cell, said first gate electrode region defining a gate of at least said first PU/PD transistor and said first driver transistor, said second gate electrode region defining a gate of at least said first cell pass transistor and said first buffer pass transistor, and said third gate electrode region defining a gate of said second PU/PD transistor; and
at least one coupling region mask comprising a plurality of coupling features for said cell, said plurality of coupling features comprising at least a first coupling feature for coupling said third gate electrode region to said first storage node and at least a second coupling feature for coupling said first gate electrode region to said second storage node,
wherein first cell pass transistor is coupled to said first storage node, said first buffer pass transistor and said first driver transistor are coupled to a source/drain path of said first cell pass transistor, and said first buffer pass transistor is coupled between said a first bitline (BL) node and first said driver transistor.

12. The mask set of claim 11, wherein said first plurality of source/drain features defines at least a first cell source/drain feature for defining at least said first PU/PD transistor and at least a second cell source/drain feature for defining at least said first driver transistor and said first buffer pass transistor, and wherein one of said first and said second source/drain features further defines said first cell pass transistor.

13. The mask set of claim 12, wherein said second cell source/drain feature defines said second cell pass transistor, and wherein said second cell source/drain feature comprises an extension region feature for said for defining said second cell pass transistor.

14. The mask set of claim 13, wherein said coupling features comprise at least a third coupling feature for electrically connecting said first cell pass transistor and said first buffer pass transistor.

15. The integrated circuit of claim 14, wherein said coupling features comprise at least one metal interconnection feature, a low resistivity silicon-comprising interconnection feature, or a low resistivity diffusion feature.

16. The mask set of claim 11, further comprising:
at least a second source/drain mask comprising a second plurality of source/drain features for said memory cell, said second plurality of source/drain features defining source/drains of a third PU/PD transistor coupled to said first storage node and a fourth PU/PD transistor coupled to said second storage node;
wherein said second body region and said second plurality of source/drain features define oppositely doped regions, wherein said first and said second body features define oppositely doped body regions,
wherein said plurality of coupling features further define first additional coupling features for coupling first and said second PU/PD transistors to a first voltage node, wherein said plurality of coupling features further define second additional coupling features for coupling said third and said fourth PU/PD transistors to a second voltage nodes wherein said first gate electrode region further defines a gate of said third PU/PD transistor, and wherein said third gate electrode region further defines a gate of said fourth PU/PD transistor.

17. The mask set of claim 16, wherein said first plurality of source/drain regions defines a plurality of n-type source/drain regions, and wherein said second plurality of source/drain regions defines a plurality of p-type source/drain regions.

18. The mask set of claim 11, wherein an average channel width defined by said first plurality of source/drain features defining first driver transistor in said memory cells is greater than or equal to the sum of an average channel width defined by said first plurality of source/drain features defining said first buffer pass transistor and an average width of said first cell pass transistor in said memory cells.

19. The mask set of claim 11, wherein an average gate channel length defined by said first plurality of source/drain features defining said first buffer pass transistor in said plurality of memory cells is at least 5% percent less than an average gate channel length of said first cell pass transistor in said plurality of memory cells.

20. The mask set of claim 11, wherein said first plurality of source/drain features further comprises at least a third cell source/drain feature defining said second PU/PD transistor and at least a fourth cell source/drain feature defining a second driver transistor and a second buffer pass transistor, wherein one of said third and said fourth cell source/drain features further define a second cell pass transistor, said third gate electrode region further defines a gate of said second driver transistor, said gate electrode features further defines a fourth gate electrode region defining a gate of said second cell pass transistor and said second buffer pass transistors, said second cell pass transistor being coupled to said second storage node, said second buffer pass transistor and said second driver transistor being coupled to a source/drain path of said second cell pass transistor, and said second buffer pass transistor being coupled between said a second BL node and said second driver transistor.

* * * * *